(12) United States Patent
Ueno

(10) Patent No.: US 7,933,675 B2
(45) Date of Patent: Apr. 26, 2011

(54) MACHINING APPARATUS FOR DRILLING PRINTED CIRCUIT BOARD

(75) Inventor: Yasunobu Ueno, Ebina (JP)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 216 days.

(21) Appl. No.: 12/034,317

(22) Filed: Feb. 20, 2008

(65) Prior Publication Data

US 2008/0223833 A1    Sep. 18, 2008

(30) Foreign Application Priority Data

Mar. 14, 2007    (JP) ................................. 2007-065313

(51) Int. Cl.
 *G06F 19/00* (2006.01)
 *B23K 26/16* (2006.01)
 *B23K 26/02* (2006.01)
 *B23K 26/14* (2006.01)

(52) U.S. Cl. ... 700/166; 700/194; 700/195; 219/121.67; 219/121.82

(58) Field of Classification Search .................. 700/166, 700/194, 195; 219/121.67, 121.82
See application file for complete search history.

(56) References Cited

U.S. PATENT DOCUMENTS

| 5,985,680 A * | 11/1999 | Singhal et al. ..................... 438/7 |
| 6,239,406 B1 * | 5/2001 | Onoma et al. ........... 219/121.82 |
| 6,353,203 B1 * | 3/2002 | Hokodate et al. ........ 219/121.67 |
| 2004/0129685 A1 * | 7/2004 | Arai et al. .................. 219/121.7 |

* cited by examiner

*Primary Examiner* — Albert Decady
*Assistant Examiner* — Sivalingam Sivanesan
(74) *Attorney, Agent, or Firm* — Crowell & Moring LLP

(57) ABSTRACT

A machining apparatus in which the machining efficiency can be improved even if characters are machined in a printed circuit board. A coordinate transformation unit is provided for transforming central coordinates of each dot d of each character of a character string into coordinates in a machining coordinate system with which the holes will be machined. Prior to machining, based on a character string and position information of the character string described in a machining program, central coordinates of each dot of each character of the character string are transformed into coordinates in the machining coordinate system with which the holes will be machined. Each dot d is regarded as a hole and machined. The number of times of movement of a table can be thus minimized so that the machining efficiency can be improved.

1 Claim, 5 Drawing Sheets

MACHINING APPARATUS FOR DRILLING PRINTED CIRCUIT BOARD

FIELD OF THE INVENTION

The present invention relates to a machining apparatus for drilling a printed circuit board with a pulsed laser beam while machining (writing) characters on the surface of the printed circuit board.

BACKGROUND OF THE INVENTION

FIG. 3 is a schematic configuration view of a laser machining apparatus for drilling a printed circuit board. FIG. 4 is a plan view of a printed circuit board as a work piece. FIG. 5 is a chart showing an example of a machining program. FIG. 6 is a diagram showing an example of a dot pattern forming characters, which pattern has been registered in an NC unit.

As shown in FIG. 3, a machining apparatus 100 for drilling a printed circuit board is constituted by a machining apparatus body 80 and an NC unit 90. The machining apparatus body 80 has a table 1, a laser oscillator 2, a head portion 3, etc. The table 1 is movable in X- and Y-directions. The NC unit 90 controls the operation of the machining apparatus body 80. A pair of steerable mirrors 4 and an fθ lens 5 are disposed in the head portion 3. A galvanometric control unit 6 controls the positions (rotation angles) of the steerable mirrors 4. A table control unit 7 controls the position of the table 1. A printed circuit board (hereinafter referred to as "workpiece") 8 is fixed to the table 1.

A laser beam emitted from the laser oscillator 2 is positioned by the pair of steerable mirrors 4, and passed through the fθ lens 5 so as to be incident on the work piece 8 perpendicularly thereto. The time required for moving the table 1 is much longer than the time interval of irradiation with the laser beam or the duration of the irradiation. The machining efficiency can be therefore much higher if the laser beam is positioned by the steerable mirrors 4. The practical size (diameter) of the fθ lens 5 is 50-70 mm. When the diameter of the fθ lens 5 is, for example, 70 mm, the work piece 8 is segmented into regions (hereinafter referred to as "to-be-machined regions") measuring 50 mm by 50 mm around the central axis of the fθ lens 5 as shown in FIG. 4 (where there are 24 to-be-machined regions segmented by the broken lines) When machining is finished in one to-be-machined region, the table 1 is moved horizontally so that the center of the next to-be-machined region is positioned on the central axis of the fθ lens 5. Such an operation is repeated subsequently till machining is completed all over the to-be-machined regions.

As shown in FIG. 5, central coordinates (portion F in FIG. 5) of each to-be-machined region, central coordinates (portion G in FIG. 5) of each hole to be machined, a instructed character string (portion H in FIG. 5, in which the three characters "ABC" are instructed here), and reference position coordinates (portion J in FIG. 5) for the characters are described in the machining program.

As shown in FIG. 6, each character is designed to be disposed in an area D constituted by squares M with m rows and n columns (for example, 7 rows and 4 columns). The side of each square M measures a. One dot d can be placed in each square M. The center of the square M in the lower left corner of the area D is regarded as a reference position (origin) P0. With reference to the reference position P0, the central coordinates of each dot d forming each character are stored in a storage in advance. When a character string is to be machined, the character string (portion H) and the reference position coordinates (portion J) are instructed. When a character string consisting of a plurality of characters is to be machined, the center of the square M in the lowest left-end corner of the left-end character is regarded as the reference position P0 of the character string. Characters placed adjacent to each other are separated at a distance a. That is, the central coordinates of the dot d referenced by the sign P in FIG. 6 is dP(7a, 3a) by way of example.

Next, a machining procedure to machine characters in the background art will be described.

First, holes in one to-be-machined region are machined based on the instruction of a portion F and a portion G in a machining program. Assume that there is an instructed character string to be machined in the to-be-machined region. In this case, after the holes in the to-be-machined region are machined out, the table 1 is moved based on the description of a portion J, and a reference position P0 of the character string is positioned in the center of the fθ lens 5. The center of each dot d forming each character ABC is irradiated with a laser beam. There may be some characters that cannot be written, that is, the character string may go beyond an end portion of the to-be-machined region. In this case, the characters that can be written in the to-be-machined region are machined out. After that, the table 1 is moved, and the center of the square M in the lowest left-end corner of the first one of the characters that have not been written yet is positioned in the center of the fθ lens 5. Then the characters that have not been written yet are machined. After that, the center of the next to-be-machined region is positioned in the center of the fθ lens 5.

As described above, the time required for moving the table is much longer than the time interval of irradiation with a laser beam or the duration of the irradiation. Accordingly, when the table is moved to machine characters, the time required for moving the table must take part in the machining time. Thus, the machining efficiency cannot be improved.

SUMMARY OF THE INVENTION

An object of the present invention is to provide a machining apparatus for drilling a printed circuit board in which the machining efficiency can be improved in case that characters are machined in a work piece.

In order to attain the aforementioned object, the present invention provides a machining apparatus for irradiating a printed circuit board with a pulsed laser beam based on position information of holes to be machined, a character string and position information of the character string described in a machining program, including: a storage for storing dot position information of characters of the character string character by character, each character being formed out of a plurality of dots; and a coordinate transformation unit for transforming central coordinates of each dot of each character of the character string into coordinates in a machining coordinate system with which the holes will be machined; wherein prior to machining, central coordinates of each dot of each character forming the character string are transformed into coordinates in the machining coordinate system with which the holes will be machined, and the each dot is regarded as one of the holes and machined.

The machining efficiency can be improved in case that characters are machined in a work piece.

DETAILED DESCRIPTION OF THE EMBODIMENTS

The present invention will be described below with reference to the drawings.

Figure 1:
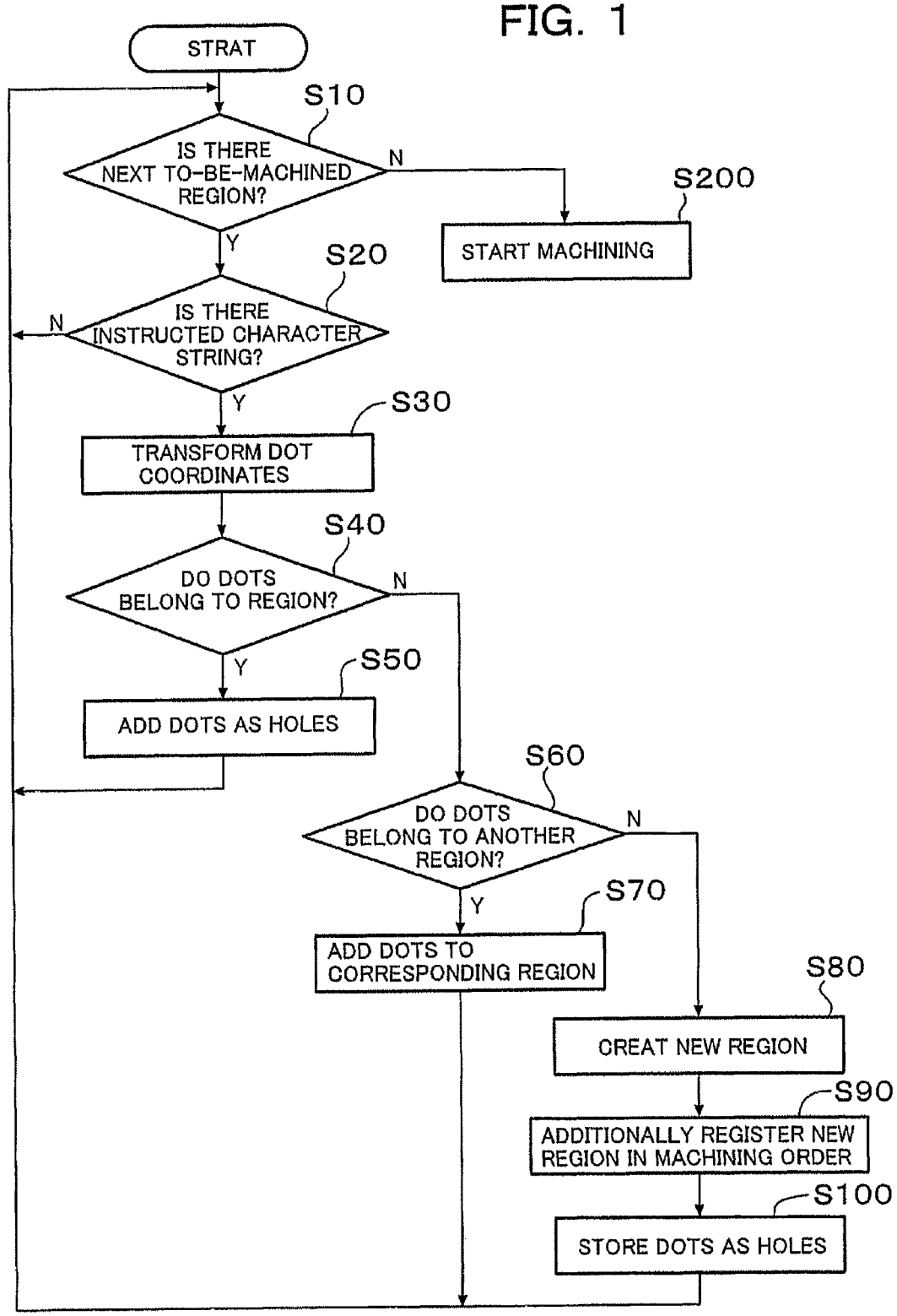
FIG. 1 is a flowchart showing the operation of a machining apparatus for drilling a printed circuit board according to the present invention.
Figure 2A:
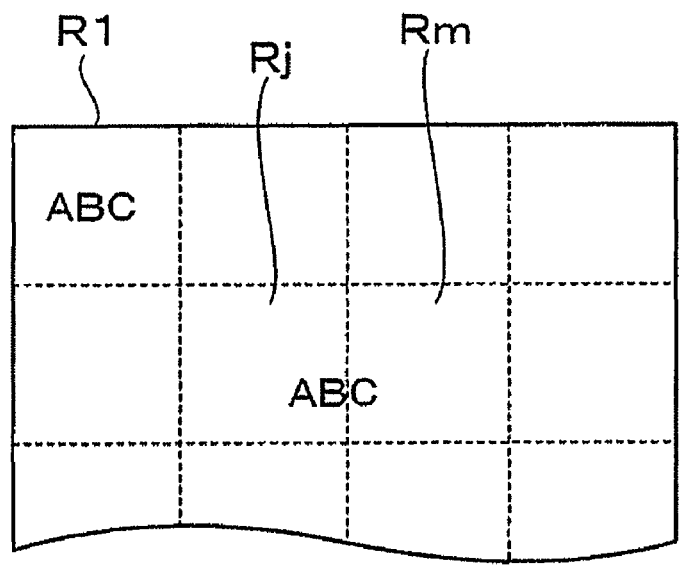
FIGS. 2A and 2B are plan views of a work piece.
Figure 2B:
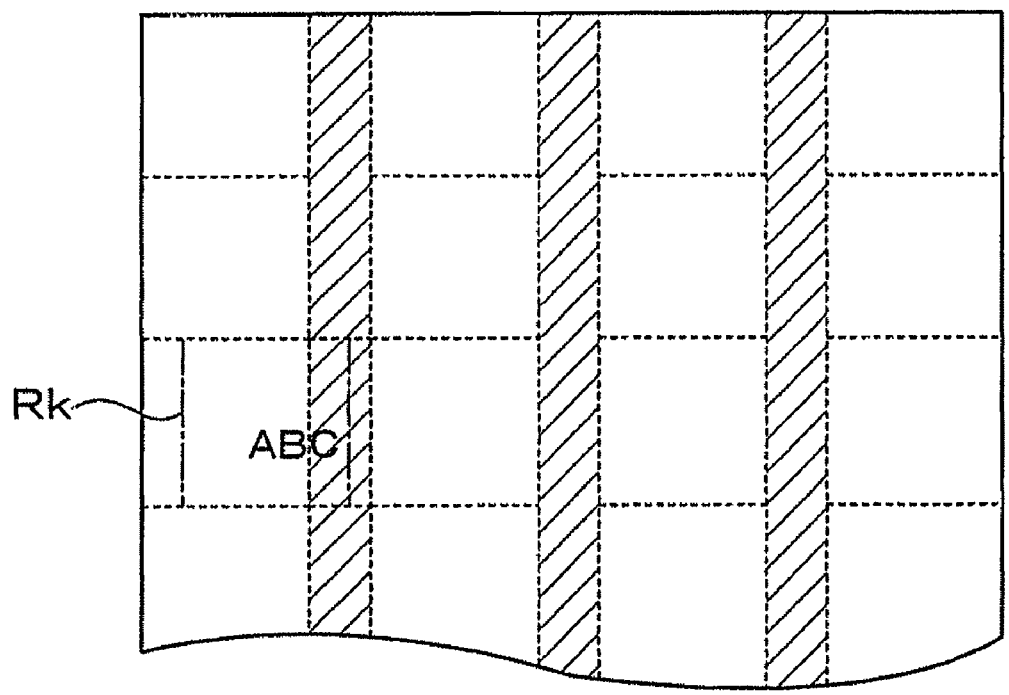
Figure 3:
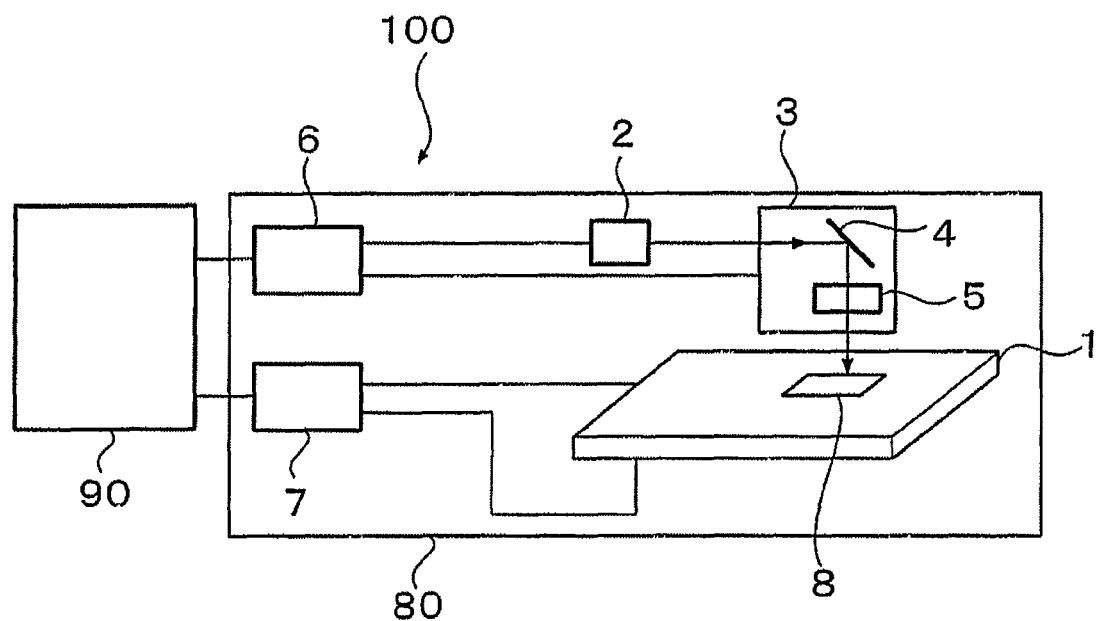
FIG. 3 is a schematic configuration view of a laser machining apparatus for drilling a printed circuit board.
Figure 4:
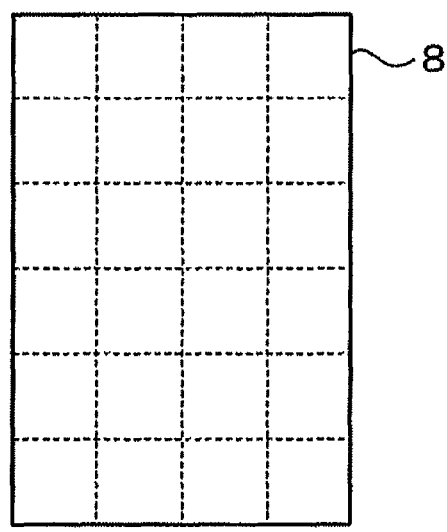
FIG. 4 is a plan view of a printed circuit board as a work piece.
Figure 5:
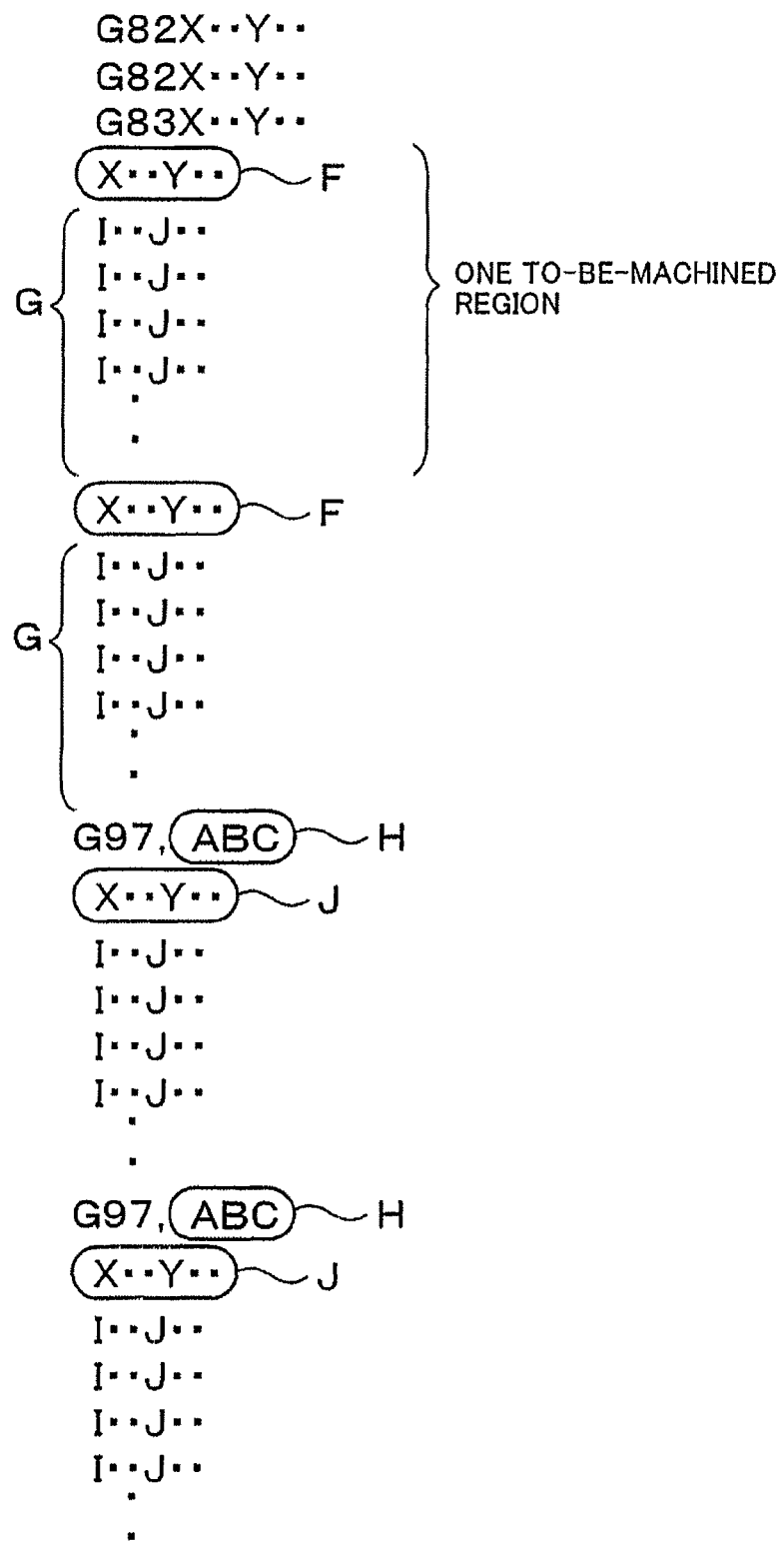
FIG. 5 is a chart showing an example of a machining program.
Figure 6:
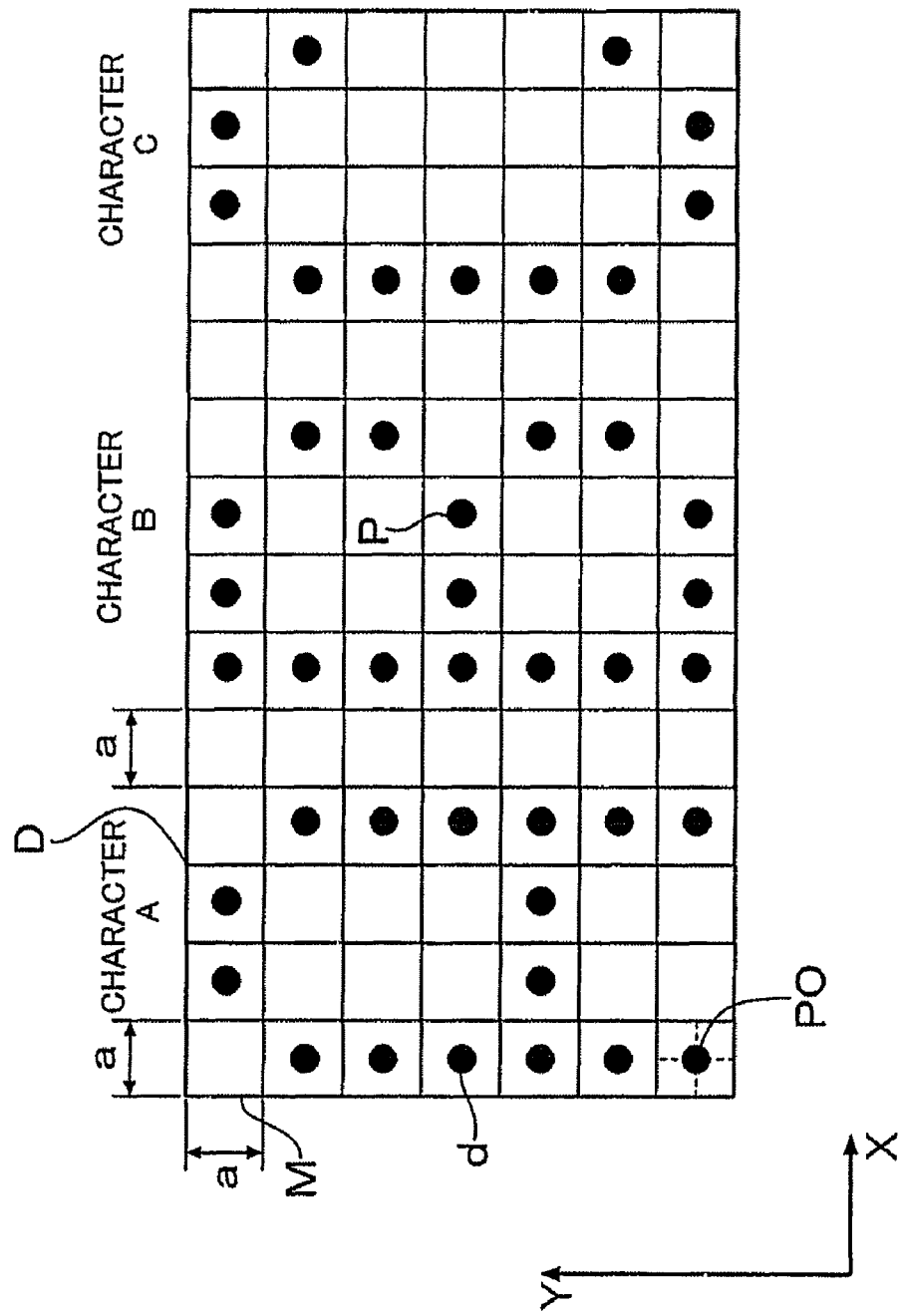
FIG. 6 is a diagram showing an example of dot patterns forming characters.

FIG. 1 is a flowchart showing the operation of a machining apparatus for drilling a printed circuit board according to the present invention. FIGS. 2A and 2B are plan views of a work piece. FIG. 2A shows the case where a character string is in a to-be-machined region. FIG. 2B shows the case where a character string extends to the outside of a predetermined to-be-machined region, and where no hole to be machined is in any shaded portion. The machining apparatus has the same configuration as that in the background art except an NC unit. The configuration of the machining apparatus will not be described redundantly. Machining intended holes will be referred to as hole machining, and machining dots forming characters will be referred to as dot machining. Assume herein that the central position coordinates of each of to-be-machined regions and the order of the to-be-machined regions (that is, moving sequence of a table) are determined in advance, and the central coordinates of each hole to be machined in each to-be-machined region are instructed. As shown in FIG. 5, in the machining program, character strings are instructed in a lump after the instruction of the to-be-machined regions (including central coordinates of holes).

Once a not-shown machining start button is turned on, the following operation will be performed prior to actual machining (S200). That is, whether there is a next to-be-machined region with respect to which data processing needs or not is confirmed based on the predetermined order of to-be-machined regions. Processing of Step S20 is performed when there is a next to-be-machined region, and otherwise processing of Step S200 is performed (Step S10). In Step S20, it is confirmed whether there is or not an instruction for a character string (including the case of one character) to be machined in the to-be-machined region, that is, whether there is or not an instruction of the reference position coordinates of a leading character. Processing of Step S30 is performed when there is an instruction for a character string to be machined, and otherwise the processing of Step S10 is performed.

In Step S30, the central coordinates of dots of each character forming the character string are transformed into coordinates in a machining coordinate system for hole machining. It is confirmed whether all the dots belong to the to-be-machined region or not (Step S40). When all the dots belong to the to-be-machined region as shown in a region R1 in FIG. 2A, the transformed coordinates of the dots are regarded as the central coordinates of holes respectively and added to the coordinates of holes to be machined in the to-be-machined region (Step S50). The processing of Step S10 is then performed. When it turns out in Step S40 that some dots do not belong to the to-be-machined region, it is confirmed whether those dots belong to another to-be-machined region or not (Step S60). When the dots belong to another to-be-machined region (to-be-machined region Rm in FIG. 2A), the transformed coordinates of the dots are added to the coordinates of holes to be machined in the to-be-machined region the dots belong to (Step S70). The processing of Step S10 will be then performed. FIG. 2B shows a case where some dots do not belong to any to-be-machined region. In such a case, a new to-be-machined region Rk including the dots which do not belong to any existing to-be-machined region is created (Step S80). The created to-be-machined region Rk is additionally registered in the machining order (Step S90), and the transformed coordinates of each dot belonging to the to-be-machined region Rk are stored (Step S100). The processing of Step S10 is then performed.

In Step S200, actual machining is started. The actual machining is performed in the same manner as in the background art. The description of the actual machining will be therefore omitted.

In this embodiment, all the central coordinates of dots are replaced by the central coordinates of holes respectively. If a new to-be-machined region is not created in Step S80, the table can be moved in the same manner as in the case where no character string is instructed. It is therefore possible to improve the machining speed.

The central coordinates of the new to-be-machined region Rk created in Step S80 may be defined so that the moving distance of the table can be made the shortest. For example, the central coordinates may be defined so that the outermost character of the character string can be set in the outermost portion of the to-be-machined region Rk as shown by the chain double-dashed line in FIG. 2B.

What is claimed is:

1. A machining apparatus for performing hole machining operations and dot machining operations on a printed circuit board by irradiating the printed circuit board with a pulsed laser beam wherein the printed circuit board is segmented into a plurality of regions, the machining apparatus comprising:
   a storage unit for storing a machining program that includes position information of holes to be machined and position information of characters of a character string to be machined, wherein each character is formed of a plurality of dots and the position information of each character includes central coordinates of each dot of the character; and
   a coordinate transformation unit for transforming the central coordinates of each dot of each character into coordinates in a machining coordinate system for performing the hole machining operations, wherein:
   prior to machining, each dot is confirmed as to which of the regions it belongs and the transformed coordinates of the dot are added to the machining program as the location of one of the dots to be machined in the confirmed region, and
   during machining, the machining apparatus performs the hole and dot machining operations on a region-by-region basis according to the position information of the holes to be machined and the transformed coordinates of the dots to be machined.

* * * * *